(12) United States Patent
Kotowski et al.

(10) Patent No.: US 10,200,017 B2
(45) Date of Patent: Feb. 5, 2019

(54) SELF-SETTING/RESETTING LATCH

(71) Applicant: Atmel Corporation, San Jose, CA (US)

(72) Inventors: Jeffrey P. Kotowski, Nevada City, CA (US); Danut Manea, Saratoga, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 15/240,983

(22) Filed: Aug. 18, 2016

(65) Prior Publication Data

US 2018/0054189 A1    Feb. 22, 2018

(51) Int. Cl.
  *G11C 7/10* (2006.01)
  *H03K 3/356* (2006.01)

(52) U.S. Cl.
  CPC .......... *H03K 3/356113* (2013.01); *G11C 7/10* (2013.01)

(58) Field of Classification Search
  CPC ............................ H03K 3/356113; G11C 7/10

USPC ...................................................... 365/189.05
  See application file for complete search history.

(56) References Cited

U.S. PATENT DOCUMENTS

| | | | | |
|---|---|---|---|---|
| 4,047,194 A | * | 9/1977 | Nakamura ............. | G03B 7/083 396/167 |
| 5,325,325 A | * | 6/1994 | Azuma ................. | G11C 11/419 365/149 |

* cited by examiner

*Primary Examiner* — Tha-O H Bui
(74) *Attorney, Agent, or Firm* — Fish & Richardson P.C.

(57) ABSTRACT

A self-setting/resetting latch circuit is disclosed that includes resistive loads for inverters used for setting and clearing the latch. In a first embodiment, the resistive loads cause the latch circuit to automatically set in response to a power supply voltage going low. In an alternate embodiment, the latch circuit is configured to be self-resetting or self-clearing when the power supply voltage goes low by reversing the set and clear terminals of the latch circuit and selecting a different node to be the output terminal of the latch circuit. The disclosed latch circuit is small and robust and draws zero power in the set state.

8 Claims, 2 Drawing Sheets

SELF-SETTING/RESETTING LATCH

TECHNICAL FIELD

The subject matter of this disclosure relates generally to latch circuits.

BACKGROUND

A latch circuit has two stable states and can be used to store state information. The circuit can be made to change state by signals applied to one or more control inputs and will have one or two outputs. One of the inputs is called the set input; the other is called the reset or clear input Latch circuits can be either active-high or active-low. The difference is determined by whether the operation of the latch circuit is triggered by high or low signals on the inputs. For an active-high circuit configuration both inputs are tied to ground and the latch circuit is triggered by a momentary high signal on either of the inputs. For an active-low configuration, both inputs are high and the latch circuit is triggered by a momentary low signal on either input. Some latch circuits have a second output that is the first output inverted. Some applications, such as applications that use power on reset (POR), have undefined low voltage states where below a threshold voltage it is impossible to guarantee proper operation of the latch. In critical applications that use POR an undefined low voltage state may not be acceptable.

SUMMARY

A self-setting/resetting latch circuit is disclosed that includes resistive loads for cross-coupled inverters used for setting and clearing the latch. In a first embodiment, the resistive loads cause the latch circuit to automatically set in response to a power supply voltage going low. In an alternate embodiment, the latch circuit is configured to be self-resetting or self-clearing when the power supply voltage goes low by reversing the set and clear terminals of the latch circuit and selecting a different node to be the output terminal of the latch circuit. The disclosed latch circuit is small and robust and draws zero power in the set state.

In an embodiment, a latch circuit comprises: a first transistor (M1) having gate, source and drain terminals, the source terminal coupled to a negative power supply terminal (VNEG), the drain terminal coupled to an output terminal (OUT) of the latch circuit; a first resistor (R3) having two terminals, a first terminal coupled to the gate terminal of M1 and a second terminal coupled to VNEG; a second transistor (M3) having gate, source and drain terminals, the drain terminal coupled to the gate terminal of M1 and the first terminal of R3, the source terminal coupled to a positive power supply terminal (VPOS); a second resistor (R0) having two terminals, a first terminal coupled to the gate of M3 and a second terminal coupled to VPOS; a third transistor (M4) having gate, source and drain terminals, the gate terminal coupled to a clear terminal (CLEAR) of the latch circuit, the drain terminal coupled to OUT and the first terminal of R0 and the source terminal coupled to VNEG; and a fourth transistor (M2) having gate, source and drain terminals, the gate terminal coupled to a set terminal (SET) of the latch circuit, the drain terminal coupled to the drain terminal of M3, the gate terminal of M1 and the first terminal of R3, and the source terminal coupled to VNEG.

DETAILED DESCRIPTION

Example Circuit

Figure 1A:
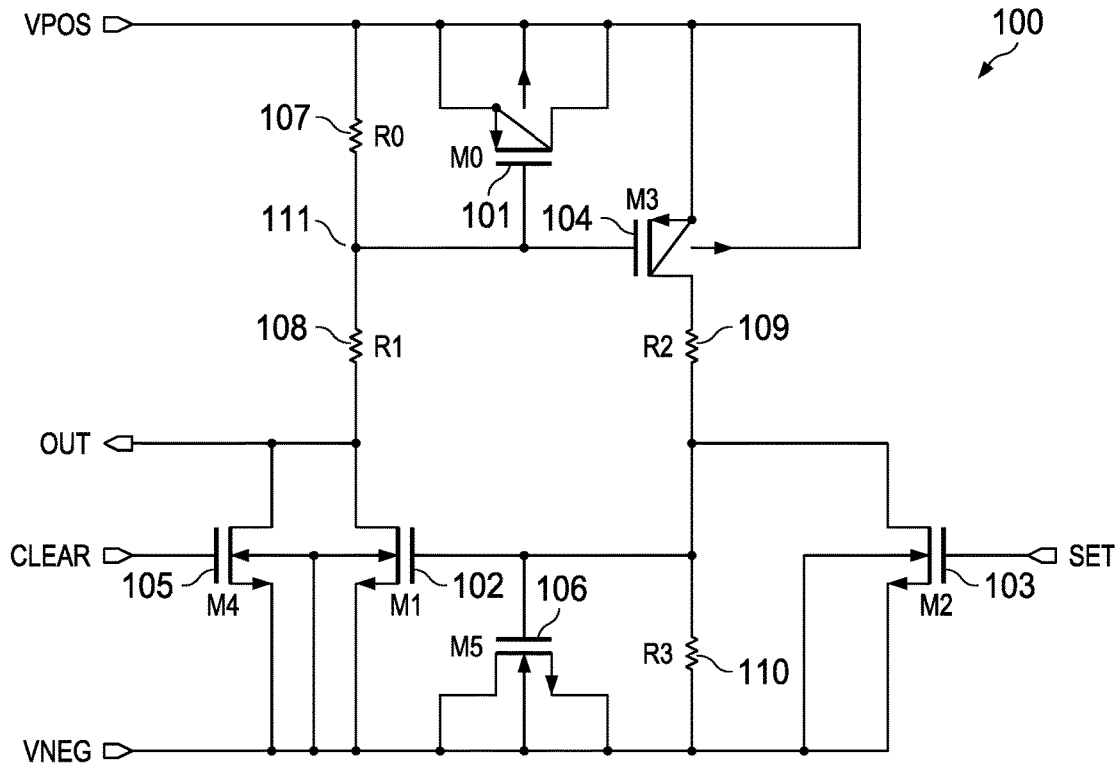
FIG. 1A is a circuit diagram of an example self-setting latch circuit, according to an embodiment.

FIG. 1A is a diagram of self-setting latch circuit 100, according to an embodiment. Latch circuit 100 includes transistors 101-106 (M0-M6) and resistors 107-110 (R0-R3). Latch circuit 100 can be included in another circuit to process critical signals, such as memory (e.g., a serial EEPROM, SRAM) used in critical applications or used as a memory cell in cache memory of a microcontroller. The memory cell can be one of a plurality of memory cells in a memory cell array that is coupled to an interface that includes row and column selection circuitry (e.g., multiplexer, demultiplexer) and signal conditioning circuitry. A memory controller can be coupled to the interface or included in the interface to read and write data to the memory cells in the memory cell array.

Latch circuit 100 includes two cross-coupled inverters. A first inverter comprises transistor M1 and resistors R0 and R1. The second inverter comprises transistor M3 and resistors R2 and R3. Transistor M4 implements a clear function and transistor M2 implements a set function for latch circuit 100. Latch circuit 100 includes positive and negative supply voltage terminal (VPOS, VNEG), output terminal (OUT), set terminal (SET) and clear terminal (CLEAR).

The ratio of R3 to R2 (a voltage divider) can be set to adjust a threshold voltage at which latch circuit 100 is automatically set. When the voltage at the gate of transistor M1 is no longer sufficient (greater than a threshold plus the drain-source voltage at saturation (vdsat) of transistor M1), the output OUT will go high. When OUT goes high transistor M3 is turned off and the positive feedback of latch circuit 100 will maintain the SET state. The operation is similar for R0 and R1 connected to the gate of transistor M3. Transistor M4 is connected to the output terminal OUT, but could instead be connected to node 111 shared by resistors R0 and R1 (a voltage divider). This alternate connection would assure a clear at lower supply voltage.

In an embodiment, transistors M1, M2, M4, M5 are n-channel metal-oxide semiconductor (NMOS) transistors and transistors M0, M3 are p-channel metal-oxide semiconductor (PMOS) transistors. Resistors R1 and R2 are optional and are used with R0 and R3 to set a voltage threshold below which latch circuit 100 will self-set. Transistors M0 and M5 are also optional and are used to add gate-source capacitance (cgs) to the cgs of transistors M3 and M1, respectively. In the embodiment shown in FIG. 1A, latch circuit 100 is self-setting. To make latch circuit 100 self-resetting or self-clearing, the CLEAR and SEND terminals can be reversed and the OUT terminal can be connected to the drain of transistor M3.

Figure 1B:
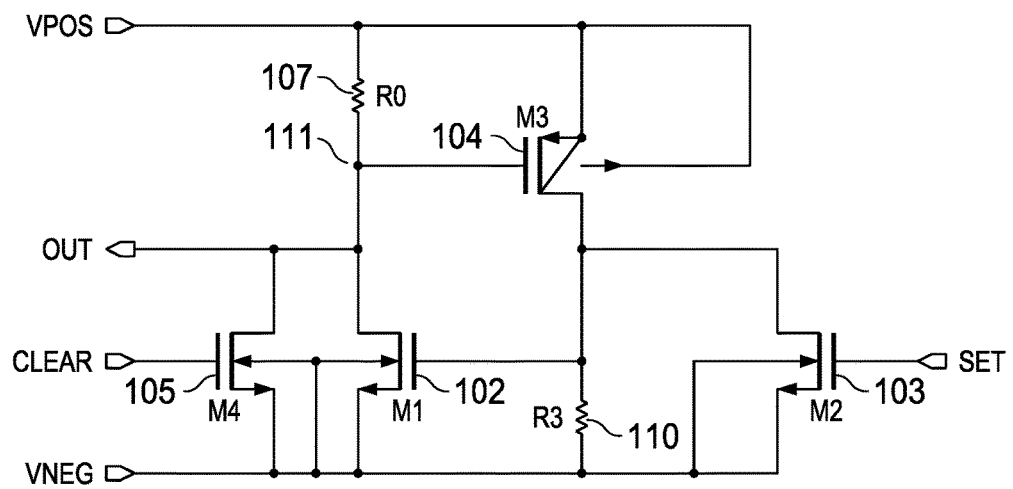
FIG. 1B is a circuit diagram of the example self-setting latch circuit of FIG. 1 with optional components removed.

FIG. 1B is a circuit diagram of the example self-setting latch of FIG. 1 with optional transistors M0, M5 and optional resistors R1 and R2 removed. The first inverter includes transistor M1 and resistor R0 and the second inverter includes transistor M3 and resistor R3. A source terminal of transistor M1 is coupled to a negative power supply terminal (VNEG) and a drain terminal of M1 is coupled to an output terminal (OUT) of the latch circuit. A first terminal of resistor R3 is coupled to the gate terminal of M1 and a second terminal of R3 is coupled to VNEG. A drain terminal of transistor M3 is coupled to the gate terminal of M1 and the first terminal of R3. A source terminal of M3 is coupled to a positive power supply terminal (VPOS). A first terminal of resistor R0 is coupled to a gate terminal of M3 and a second terminal of R0 is coupled to VPOS. A gate terminal of transistor M4 is coupled to a clear terminal (CLEAR) of the latch circuit, a drain terminal of M4 is coupled to OUT and the first terminal of R0 and a source terminal of M4 is coupled to VNEG. A gate terminal of transistor M2 is coupled to a set terminal (SET) of the latch circuit, a drain terminal of M2 is coupled to the drain terminal of M3, the gate terminal of M1 and the first terminal of R3, and a source terminal of M2 is coupled to VNEG.

Figure 2:
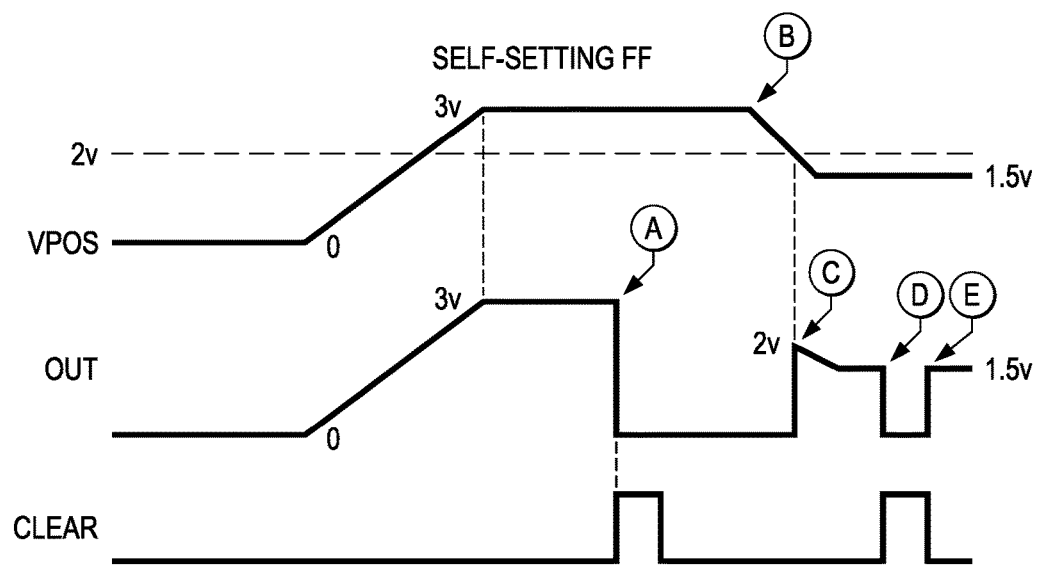
FIG. 2 are shows example waveforms illustrating operation of the self-setting latch circuit of FIG. 1A, according to an embodiment.

FIG. 2 shows example waveforms illustrating operation of the self-setting latch circuit 100 of FIG. 1A, according to an embodiment. Three waveforms are shown for VPOS, OUT and CLEAR. Time is increasing from left to right. Each time point of interest discussed is represented by a letter.

At time 0, VPOS rises and OUT follows VPOS. At time A, CLEAR goes high, causing the latch circuit to "latch" a CLEAR state with OUT=0 volts. At time B, VPOS begins to fall. At time C, OUT falls below 2 volts. Assuming R1=R0 and the threshold of M3 is about 1 volt, then M3 turns off, which turns on M1, which sets the latch circuit. At time D, CLEAR is high again and OUT is cleared. At time E, CLEAR is low and the latch circuit is self-set because the voltage divider formed by R1 and R0 (or R2 and R3) cannot maintain M3 (or M1) in an on state to keep the latch circuit in a CLEAR state.

While this document contains many specific implementation details, these should not be construed as limitations on the scope of what may be claimed but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A latch circuit comprising:
   a first inverter coupled to a supply voltage and a clear terminal, the first inverter including a first resistive load; and
   a second inverter cross-coupled to the first inverter and coupled to the supply voltage terminal and a set terminal, the second inverter including a second resistive load, wherein the first and second resistive loads cause the latch circuit to automatically set or reset in response to a change in the supply voltage, and wherein at least one of the first or second resistive loads is configured to adjust a threshold at which the latch circuit is automatically set or reset.

2. The latch circuit of claim 1, wherein the latch circuit automatically sets or resets in response to the supply voltage falling below the threshold voltage.

3. The latch circuit of claim 1, wherein the first inverter includes a first transistor and a first resistor, the first resistor coupled to a first drain terminal of the first transistor, and the second inverter includes a second transistor and a second resistor, the second resistor coupled to a second drain terminal of the second transistor.

4. The latch circuit of claim 3, wherein the first transistor is an n-channel metal-oxide semiconductor (NMOS) transistor and the second transistor is a p-channel metal-oxide semiconductor (PMOS) transistor.

5. A memory cell comprising:
   an interface;
   a latch circuit coupled to the interface, the latch circuit comprising:
      a first inverter coupled to a supply voltage and a clear terminal, the first inverter including a first resistive load; and
      a second inverter cross-coupled to the first inverter and coupled to the supply voltage terminal and a set terminal, the second inverter including a second resistive load, wherein the first and second resistive loads cause the latch circuit to automatically set or reset in response to a change in the supply voltage, and wherein at least one of the first or second resistive loads is configured to adjust a threshold at which the latch circuit is automatically set or reset.

6. The memory cell of claim 5, wherein the latch circuit automatically sets or resets in response to the supply voltage falling below the threshold voltage.

7. The memory cell of claim 5, wherein the first inverter includes a first transistor and a first resistor, the first resistor coupled to a first drain terminal of the first transistor, and the second inverter includes a second transistor and a second resistor, the second resistor coupled to a second drain terminal of the second transistor.

8. The memory cell of claim 7, wherein the first transistor is an n-channel metal-oxide semiconductor (NMOS) transistor and the second transistor is a p-channel metal-oxide semiconductor (PMOS) transistor.

* * * * *